(12) United States Patent
Mariserla et al.

(10) Patent No.: US 8,835,329 B2
(45) Date of Patent: Sep. 16, 2014

(54) REACTOR CELL ISOLATION USING DIFFERENTIAL PRESSURE IN A COMBINATORIAL REACTOR

(71) Applicant: Intermolecular, Inc., San Jose, CA (US)

(72) Inventors: Sandeep Mariserla, Danbury, CT (US); Aaron T. Francis, San Jose, CA (US); Jeffrey Chih-Hou Lowe, Cupertino, CA (US); Robert Anthony Sculac, Lake Oswego, CA (US)

(73) Assignee: Intermolecular, Inc., San Jose, CA (US)

( * ) Notice: Subject to any disclaimer, the term of this patent is extended or adjusted under 35 U.S.C. 154(b) by 154 days.

(21) Appl. No.: 13/669,664

(22) Filed: Nov. 6, 2012

(65) Prior Publication Data

US 2014/0124038 A1 May 8, 2014

(51) Int. Cl.
*H01L 21/302* (2006.01)

(52) U.S. Cl.
USPC .................. 438/745; 438/747; 257/E21.219

(58) Field of Classification Search
CPC .................. H01L 21/67086; H01L 21/67057
USPC .......................... 257/E21.219; 438/745, 747
See application file for complete search history.

(56) References Cited

U.S. PATENT DOCUMENTS 8,632,690 B2 * 1/2014 Adhiprakasha et al. ........ 216/83

FOREIGN PATENT DOCUMENTS

EP 1161988 B1 10/2004

* cited by examiner

*Primary Examiner* — Minh-Loan T Tran (57) ABSTRACT

Methods for combinatorially processing semiconductor substrates are provided. The methods may involve receiving a substrate into a combinatorial processing chamber and sealing a plurality of flow cells against a surface of the substrate. The plurality of flow cells is enclosed within the combinatorial processing chamber to define an enclosed external environment for the plurality of flow cells. A pressure differential is created between a reaction area of the plurality of flow cells of the combinatorial processing chamber and the external environment, wherein each flow cells of the plurality of flow cells defines a site isolating region of the substrate. The regions the substrate are then combinatorially processed.

20 Claims, 6 Drawing Sheets

FIG. 5

REACTOR CELL ISOLATION USING DIFFERENTIAL PRESSURE IN A COMBINATORIAL REACTOR

BACKGROUND

Combinatorial processing allows rapid evaluation of semiconductor processes. The systems supporting the combinatorial processing are flexible to accommodate the demands for running the different processes either in parallel, serial or some combination of the two.

Some semiconductor wet processing operations include operations for adding (electro-depositions) and removing layers (etch), defining features, preparing layers (e.g., cleans), etc. Similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

During combinatorial experiments it is beneficial to provide as much flexibility as possible with regard to the tools performing the processing. In addition, the equipment for performing the combinatorial experiments should be designed to minimize particle generation. It is within this context that the embodiments arise.

SUMMARY

Methods for combinatorially processing semiconductor substrates are provided. The embodiments further provide an apparatus that minimizes particle generation when processing a semiconductor substrate. Several inventive embodiments are described below.

In some embodiments, a method for combinatorially processing a substrate is provided. The method includes receiving a substrate into a combinatorial processing chamber and sealing a plurality of reactors against a surface of a substrate. The plurality of reactors is enclosed within the combinatorial processing chamber to define an enclosed external environment for the plurality of reactors. A pressure differential is created between each reactor of a plurality of reactors of the combinatorial processing chamber and the external environment of each reactor, wherein each reactor of the plurality of reactors define processing regions of the substrate. Different operations on the processing regions are performed to combinatorially process the substrate.

Other aspects will become apparent from the following detailed description, taken in conjunction with the accompanying drawings, illustrating by way of example, the principles of the embodiment.

BRIEF DESCRIPTION OF THE DRAWINGS

The present will be readily understood by the following detailed description in conjunction with the accompanying drawings, and like reference numerals designate like structural elements.

DETAILED DESCRIPTION

The embodiments described herein provide a method and apparatus for a combinatorial processing system providing for control of a sealing pressure between a reactor and a substrate surface with the assistance of controlling the differential pressure between the inner processing region of the reactor and an external environment of the reactor. It will be obvious, however, to one skilled in the art, that the present embodiments may be practiced without some or all of these specific details. In other instances, well known process operations have not been described in detail in order not to unnecessarily obscure the embodiments.

The embodiments described below provide site isolated reactors for combinatorial processing. In some embodiments the modular design enables simplified changeover to meet the demands of combinatorial processing. The embodiments further describe a method and system where the reactor cells for the system, such as the F30 system of the assignee, where the reactor to sleeve pressure against a substrate is monitored and controlled through a computing device in order to minimize leaks from the reactor and minimize particle generation due to the abrasion of the sleeve sealing surface with the surface of the substrate. In addition, the embodiments utilize a pressure differential between the processing region of the reactor cells and the external environment in order to enable a reduction of the sealing pressure against the substrate to further reduce particle generation due to abrasion of the substrate surface with the sealing surface of the reactor cell.

Through the embodiments, the pressure differential may be controlled through the monitoring and controlling of the pressure of the external environment around the reactor cells, control of the pressure within the reactor cells, or a combination of the two. In one embodiment, the external environment to the reactor cells is enclosed and in fluid communication with a pressure source, which includes a vacuum source. In another embodiment, the flow cells disposed within the reactor cells have multiple inlets and outlets providing access to the reaction region of the reactor cells. One or more of these multiple inlets or outlets may be utilized to control pressure within the reactor cells relative to the external environment.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, e.g., different substrates and chemical reactants, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning HPC processing techniques have also been successfully adapted to deposition processes such as physical vapor deposition (PVD), atomic layer deposition (ALD), and chemical vapor deposition (CVD).

Figure 1:
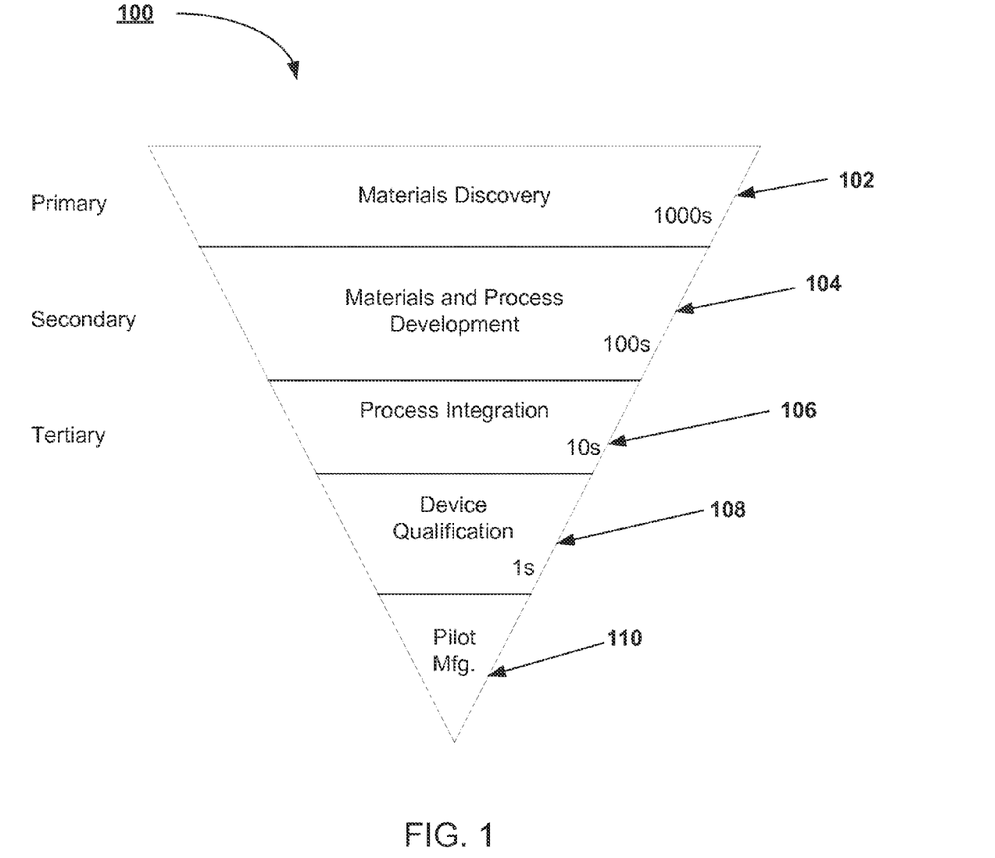
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present embodiments. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
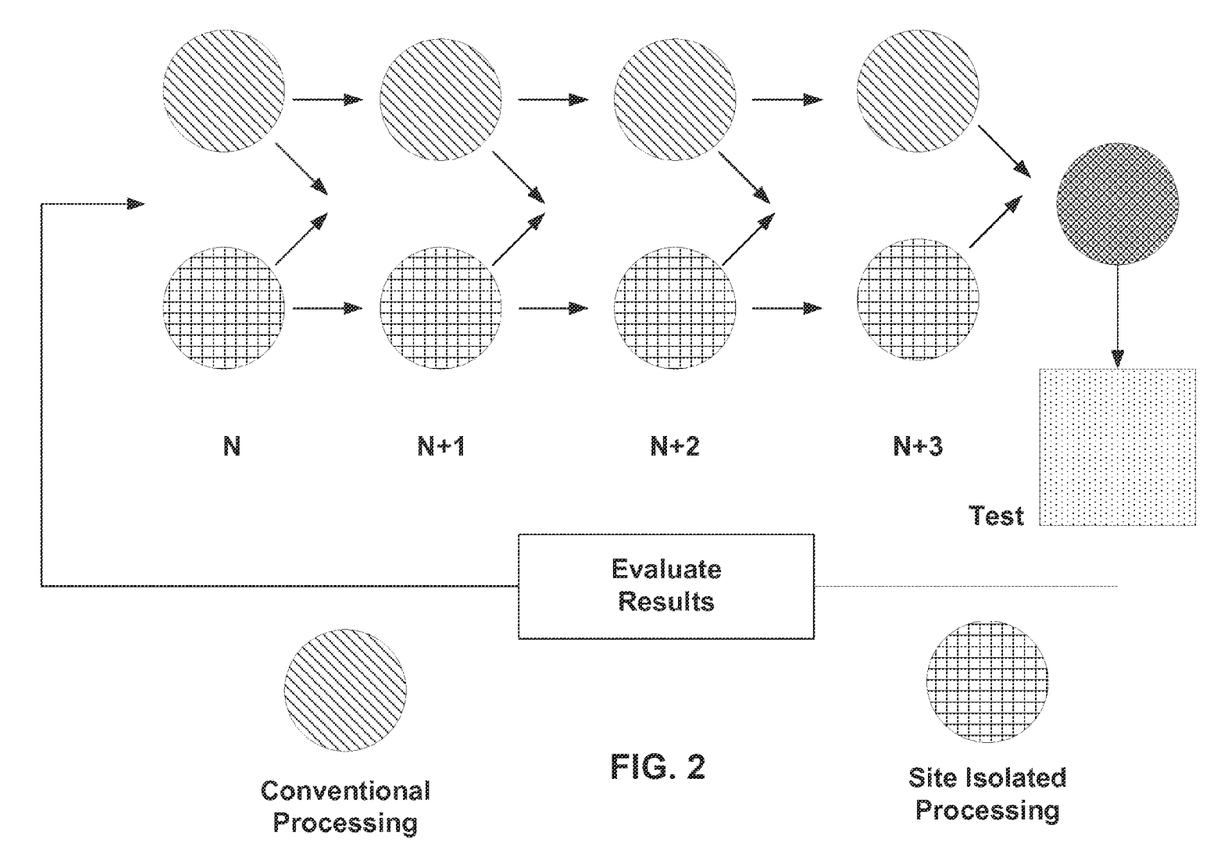
FIG. 2 is a simplified schematic diagram illustrating a general methodology for combinatorial process sequence integration that includes site isolated processing and/or conventional processing in accordance with some embodiments.

FIG. 2 is a simplified schematic diagram illustrating a general methodology for combinatorial process sequence integration that includes site isolated processing and/or conventional processing in accordance with some embodiments. In one embodiment, the substrate is initially processed using conventional process N. In one embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are illustrative and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3A:
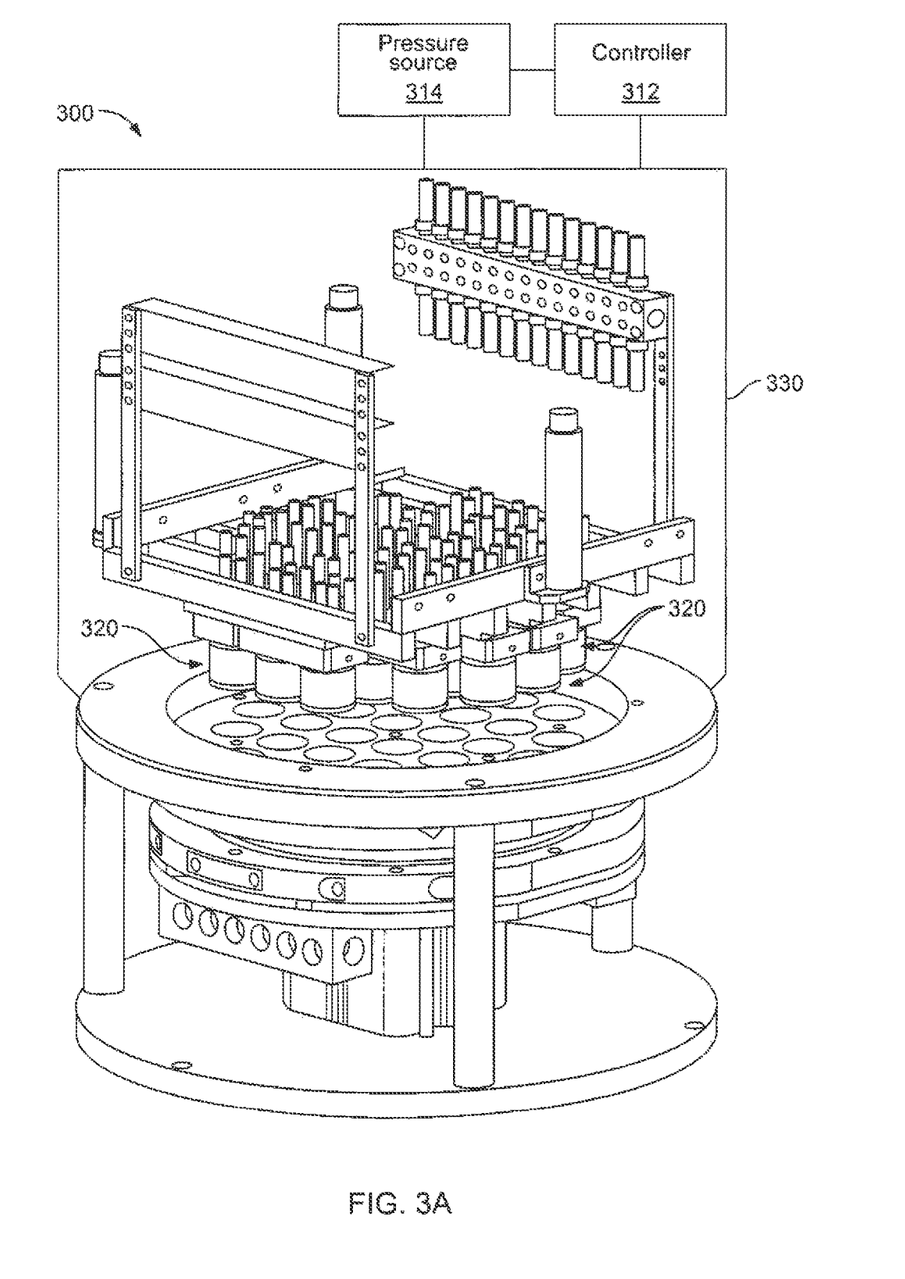
FIG. 3A is a simplified schematic diagram of a combinatorial system which may incorporate wet processing experiments or semiconductor manufacturing process sequences and unit operations in order to combinatorially evaluate various semiconductor manufacturing processes.
Figure 3B:
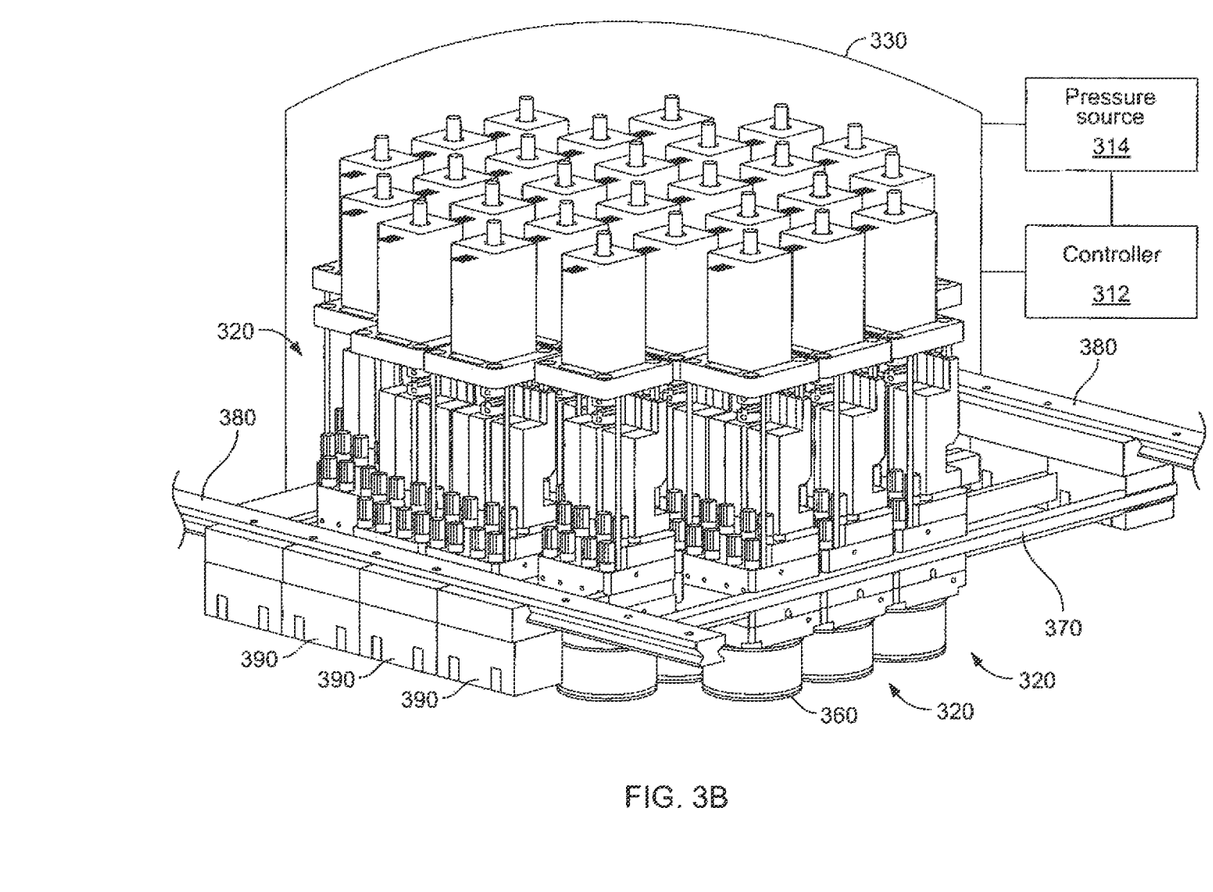
FIG. 3B is an alternative schematic diagram to FIG. 3A.

FIG. 3A is a simplified schematic diagram of a combinatorial system which may incorporate wet processing experiments, or semiconductor manufacturing process sequences, and unit operations in order to combinatorially evaluate various semiconductor manufacturing processes so that an optimum process may be found in a minimum amount of time in accordance with some embodiments. System 300 includes a plurality of flow cells 320, which may be modular in design as in order to efficiently evaluate a plurality of processes and utilize the same tool on various programs addressing customer specific problems and enabling the use of using customer specific wafers without requiring re-tooling. In some embodiments, twenty eight flow cells are provided for twenty eight discrete site isolation regions of a twelve inch wafer. It should be appreciated that this is not meant to be limiting as any number of flow cells 320 may be accommodated on a system depending on various factors including the size and shape of the substrate being evaluated, the size of the regions on the substrate, etc. It should be appreciated that a monolithic block design or a modular design utilizing a rail system, as illustrated in FIG. 3B, for the flow cell 320 may be integrated with the embodiments. A flexible reactor based system is provided in addition to a static manifold system in some embodiments. System 300 includes a plurality of connections (not shown for illustrative purposes) distributed to each of flow cells 320. One skilled in the art will appreciate that system 300 of FIG. 3A may be connected to various inputs. These inputs include a dispense manifold to dispense any process fluids utilized in the system, a mix vessel for optionally mixing fluids prior to delivery to system 300, and any required power and gas inputs to operate the system. In addition, a waste collection mechanism may be in communication to receive process fluids evacuated from the reaction chambers or bypassed through flow cells 320. It should be further appreciated that while flow cells 320 are depicted as each having a certain number of inputs and outputs, the number of inputs and outputs may be varied.

The external environment proximate to flow cells 320 of system 300, also referred to as an interstitial area, is enclosed by enclosure 330. Enclosure 330 provides the structure for maintaining a pressure within the enclosed external environment encompassed by the enclosure. Enclosure 330 may be composed of any suitable material that is compatible with the processing materials and able to withstand any desired pressures for the enclosed external environment. Controller 312 and pressure source 314 are included with system 300. Pressure source 314 provides a flow of an inert gas to the enclosed external environment in response to controller 312 in some embodiments. In some embodiments, the inert gas is nitrogen, although other gases included non-inert gases may be utilized. In other embodiments, controller 312 maintains a pressure differential between the pressure of enclosed external environment and the pressure within each reactor. The pressure differential is about one atmosphere difference with the external environment having a greater pressure in some embodiments, however, different pressure differential conditions and settings may be accommodated as the settings described herein are not meant to be limiting. As noted below, each flow cell 320 may include the capability to provide vacuum within each reactor or reaction region. Controller 312 may control the application of vacuum to each flow cell 320 in some embodiments. Thus, controller 312 may provide an inert gas to the enclosed external environment and/or apply vacuum within each flow cell. In some embodiments, the pressure within each site isolation region and the pressure within the enclosed external environment are both positive pressures, i.e., greater than atmospheric pressure, with the pressure in the enclosed external environment being greater than the pressure within each reactor region. It should be appreciated that in some instances, one pressure may be positive relative to atmospheric pressure, while another pressure is negative relative to atmospheric pressure. It should be further appreciated that system 300 is configured to concurrently process different regions of the substrate differently.

FIG. 3B is a simplified schematic diagram of an alternative combinatorial system which may incorporate wet processing experiments, or semiconductor manufacturing process sequences, and unit operations in order to combinatorially evaluate various semiconductor manufacturing processes so that an optimum process may be found in a minimum amount of time in accordance with some embodiments. Flow cells 320 are mounted on corresponding rails 370 which are supported through rails 380. A modular design is provided for flow cells 320 as well as modular blocks 390 for each corresponding row of flow cells. For example, the modular blocks 390 can be moved to adjust the pitch along the rail 380. In addition, a modular sleeve enclosure 360 is provided for a lower portion of each process module in one embodiment, thereby enabling adaptability of the system to any pitch of regions on a substrate. It should be appreciated that the fixed manifold shown in FIG. 3A can still be used, but requires machining a new manifold for each pitch variation. Enclosure 330 encloses the external environment proximate to flow cells 320. The external environment is defined between enclosure 330 and the outer surfaces of flow cells 320. Controller 312 and pressure source 314 operate to provide the pressure differential as discussed above with reference to FIG. 3A.

Flow cells 320 may be moved in one linear direction as they are slideably mounted on rails 370 of one rail system and the corresponding rows to which each flow cell belongs is slideably mounted on rails 380 of a second rail system. Thus, the movement of the rows along rails 380 is in a linear direction substantially perpendicular to the direction of movement along rails 370, enabling access to the entire surface of a substrate disposed thereunder. In this embodiment, the first row of flow cells includes three flow cells while the next row includes five and the row thereafter includes six. This pattern is repeated for the next three rows so that a total of 28 flow cells are accommodated in this configuration. For example, a 12-inch wafer having the 28 regions could be accommodated in this design. Of course, this design is not meant to be limiting as the size and shape of the flow cells or the size and shape of the substrate to be processed may be any suitable geometric shape. Those dimensions and characteristics will inform the specific default configuration of the flow cells and their positioning for any specific process. Since each flow cell 320 is modularly designed a number of different experiments may be provided with the 28 corresponding flow cells. In addition, certain flow cells may be set aside or parked outside the area of the substrate to be processed as rails 370 and 380 are configured to enable enough space to accommodate one or more flow cells 320 outside of the substrate boundary region. For example, one whole row of flow cells 320 may be moved along rails 380 outside of the substrate boundary region. Thus, through the slideable mounting and rail configuration any pitch for any substrate may be accommodated with this design. It should be noted that alternative flow cell designs may be incorporated with the modular sleeve enclosure 360, also referred to as a reaction chamber, in accordance with one embodiment. Further details on the flow cell configuration may be found in U.S. application Ser. No. 12/333,226 entitled "Modular Flow Cell and Adjustment System" filed on Dec. 11, 2008 and claiming priority to U.S. Provisional Application No. 61/013,038 filed on Dec. 12, 2007, both of which are herein incorporated by reference.

Figure 4:
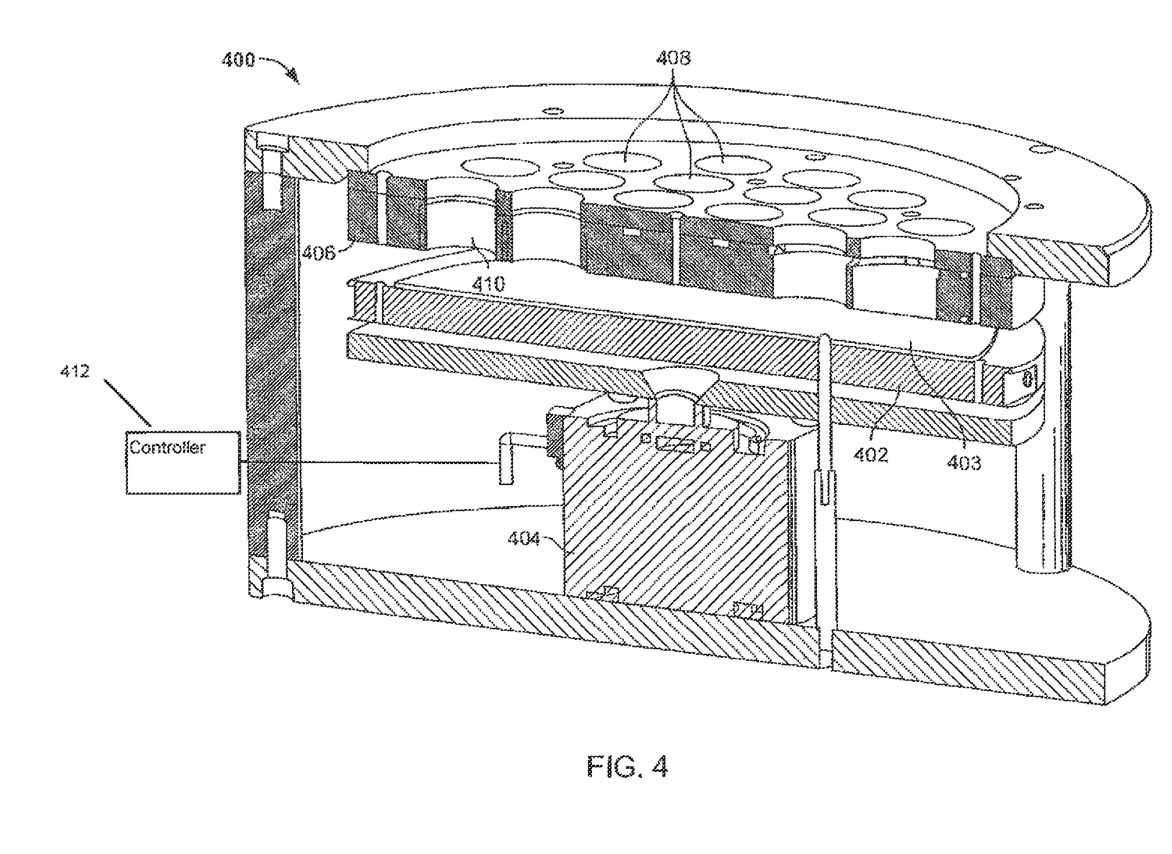
FIG. 4 is a cross sectional view of a combinatorial processing system in accordance with some embodiments.

FIG. 4 is a cross sectional view of a combinatorial processing system in accordance with some embodiments. FIG. 4 illustrates system 400 that includes a reactor block 406 disposed over stage or chuck 402 which can secure substrate 403. Reactor block 406 defines an array of reaction areas 408, which define a pattern of isolated reaction regions when sealed against a surface of substrate 403 for performing a process in each reaction region. System 400 includes a floating or removable reactor sleeve 410. Removable reactor sleeve 410 is configured to float or be dynamically positionable in each reaction area 408 of the flow cell assembly block 406 in some embodiments. Flow cell 320 of FIG. 3A may be disposed into each reaction area 408 in some embodiments.

Figure 5:
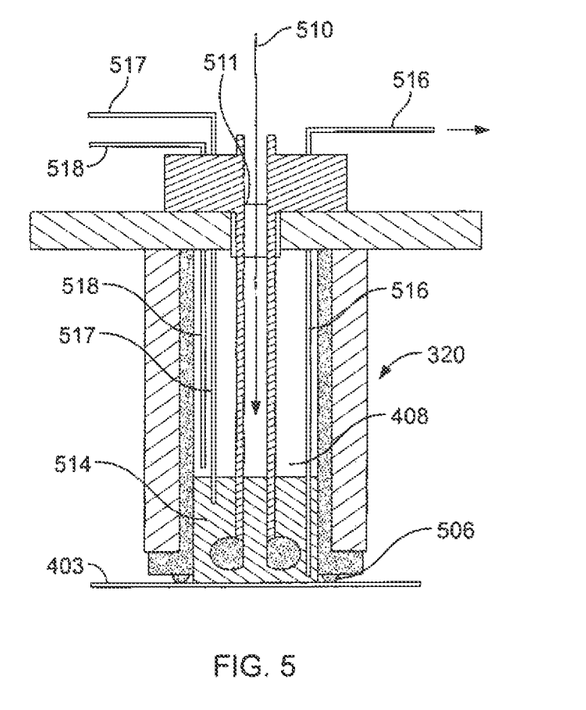
FIG. 5 is a cross sectional view of a flow cell or reactor in accordance with some embodiments.

Use of the removable sleeves 410 in each reaction area 408 allows for replacement of individual reactor walls that may become contaminated or otherwise unsuitable for continued use in a reactor. Piston 404 provides the force to raise substrate support 402 so that a surface of substrate 403 is forced against sealing surfaces of removable sleeves 410 in some embodiments. In some embodiments, piston 404 is a hydraulic piston. Controller 412 monitors and controls the sealing pressure of the substrate 403 against the sealing surfaces of removable sleeves 410. In some embodiments, the sealing pressure is controlled between about 10 pounds per square inch (psi) and about 30 psi and monitored at piston 404, i.e., the pressure supplied to piston 404 is the sealing pressure. Thus, once a desired sealing pressure is detected, controller 412 terminates the raising of substrate support 402 by terminating movement of piston 404. It should be appreciated that while a greater sealing pressure may be used, e.g., greater than 30 psi, the greater sealing pressure results in more abrasion between the sealing surfaces of the removable sleeve 410 and the surface of the substrate 403, which in turn generates increased particles. Controller 412 may be a general purpose computer or a special purpose computer. Controller 412 may be combined or integrated with controller 312 of FIGS. 3A and 3B in some embodiments to execute the functionality described herein. It should be appreciated that the pressure differential between the pressure within the enclosed external environment and the pressure within each reactor may be set at about one atmosphere so that a sealing force between the sealing surface of the flow cells and the substrate surface may be minimized, e.g., a pressure of about 10 psi. As illustrated with regard to FIG. 3, the enclosure around the external environment of the processing system enables a differential pressure to be applied between the reaction regions of the flow cells and the external environment. In some embodiments a pressure is applied to the external environment through a pressure source accessing the external environment and/or a vacuum may be applied within the flow cells through inlets as illustrated in FIG. 5. In some embodiments, the differential pressure is maintained at about 1 atmosphere. In other embodiments, the greater pressure for the external environment as compared to a lower pressure within the reactors enables slight gaps to exist between the sealing surface of a reactor and a surface of the substrate. The lower sealing force enabled by the pressure differential technique described herein results in lower particle levels being generated as the abrasion forces acting on the sleeve and the surface of the substrate are reduced. In some embodiments, reaction areas 408 are independently moveable through a rail system as described in U.S. application Ser. No. 13/313,213 entitled "Vertically retractable Flow cell System" filed on Dec. 7, 2011 and is herein incorporated by reference.

FIG. 5 is a cross sectional view of a flow cell or reactor in accordance with some embodiments. As shown in FIG. 5, when the flow cell 320 is in contact with the substrate 403, processing fluids 514 are delivered to the isolated region of the substrate 403 through a probe 510 of the delivery system. In some embodiments, the processing cell is sealed on its upper surface, such as with a septum 511. When delivering processing fluids to the flow cell 320, the probe 510 pierces the septum 511 in some embodiments. In other embodiments, the septum 511 is optional and the flow cell may be open to the external environment so that a delivery device such as a motorized syringe can provide the etchants and fluids mentioned herein. The sealing element 506 prevents the processing fluids 514 from leaving the isolated region. In other embodiments, sealing element 506 may be a removable sleeve which may have a knife edge sealing surface, as discussed in the applications incorporated by reference. It should be appreciated that the sealing mechanism may be an o-ring (as illustrated), or various geometries of the bottom surface of the removable sleeve 410 of FIG. 4, e.g., a sharp edge, lip seal, square edge, etc. It should be further appreciated that any variety of materials compatible with the processing may be utilized for the o-ring or removable sleeves. In some embodiments, the processing system is designed for the flow cell 320 to hold between about 10 µL and about 10,000 µL, although this is not meant to be limiting.

Flow cell 320 is illustrated as having a plurality of inlets and outlets. Outlet 516 is referred to as a low vacuum outlet in some embodiments. Outlet 517 may be referred to as a mid-vacuum outlet in some embodiments. As illustrated, outlet 516 extends further into the reactor than outlet 517. Inlet 518 may be utilized to dispense fluids into processing cell 320 as an alternative to probe 510. It should be appreciated that while outlets 516 and 517 are embodied as the low vacuum outlet and the mid vacuum outlet, respectively, and inlet 518 is listed as an alternative to probe 510 for dispensing fluids into flow cell 320, this configuration is not meant to be limiting. That is, each of the inlets and outlets may function as a dedicated inlet or outlet or function as a dual inlet/outlet. Through the configuration of FIG. 5 the processing fluid may be dispensed into flow cell 320, and contemporaneously with dispensing the fluid into the processing cell, the fluid may be removed through one of or both of outlets 516 and 517. In some embodiments, outlets 516 and 517 may be tubes extending into each of the reactor cells. These tubes may be utilized for removing or adding fluid into the reaction area defined within the flow cell. In some embodiments, the removing of the fluid increases the pressure of the reaction area relative to the pressure of the external environment, while the adding of the fluid decreases the pressure of the reaction area relative to the pressure of the external environment. It should be appreciated that under combinatorial processing techniques, the system described herein may be utilized where the differential pressure between the isolated region area of each flow cell and the external environment is different, as each flow cell has independent pressure capability enabled through the outlets and inlets of each flow cell. The illustration of the flow cell in FIG. 5 is not meant to be limiting as alternative flow cells, as incorporated by reference through the documents cited herein, may be integrated with the embodiments.

The embodiments provide a method for combinatorially processing a substrate. In some embodiments, a substrate is received into a combinatorial processing chamber and a pressure differential is created between each reaction area of the combinatorial processing chamber and an external environment of each reaction area. Each reaction area defines a site isolating region of the substrate when a sealing element of each reaction area contacts a surface of the substrate. Each region is then combinatorially processed as described above with reference to FIGS. 1 and 2. In some embodiments the pressure of each reaction area relative to the external environment is increased after defining the site isolating region.

Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments is not to be limited to the details given herein, but may be modified within the scope and equivalents of the appended claims. In the claims, elements and/or steps do not imply any particular order of operation, unless explicitly stated in the claims.

What is claimed is:

1. A method of combinatorially processing a substrate, the method comprising;
   receiving a substrate into a combinatorial processing chamber;
   creating a pressure differential between each reaction area of the combinatorial processing chamber and an external environment of each reaction area, wherein each reaction area defines a site isolating region of the substrate; and
   combinatorially processing each region.

2. The method of claim 1, wherein the creating the pressure differential comprises reducing a pressure of each reaction area after defining the site isolating region of the substrate.

3. The method of claim 2, wherein the reducing the pressure is achieved by removing fluid from each reaction area through a tube extending into the reaction area.

4. The method of claim 1 wherein the creating comprises increasing a pressure of the external environment relative to a pressure inside each reaction area after defining the site isolating region.

5. The method of claim 4, wherein the combinatorial processing chamber comprises an enclosure enabling the increasing the pressure of the external environment and wherein a pressure source is coupled to the enclosure.

6. The method of claim 1, further comprising:
   raising a substrate support so that a surface of the substrate support contacts a sealing element of each reaction area;
   monitoring a sealing pressure between the plurality of reaction areas and the surface of the substrate; and
   terminating the raising upon obtaining a pre-defined sealing pressure.

7. The method of claim 6, wherein the pre-defined sealing pressure is between 10 pounds per square inch (psi) and 30 psi.

8. The method of claim 1, wherein the different operations are performed contemporaneously.

9. The method of claim 1, wherein the pressure differential is at least one atmosphere and wherein a pressure of the external environment is greater than a pressure inside of each reaction area.

10. A method of combinatorially processing a substrate, the method comprising;
    receiving the substrate into a combinatorial processing chamber;
    sealing a plurality of flow cells against a surface of the substrate;
    enclosing the plurality of flow cells within the combinatorial processing chamber to define an enclosed external environment for the plurality of flow cells;
    creating a pressure differential between a reaction area of each flow cell of the plurality of flow cells of the combinatorial processing chamber and the enclosed external environment, wherein each flow cell of the plurality of flow cells defines a site isolating region of the substrate; and
    combinatorially processing each region.

11. The method of claim 10, wherein creating the pressure differential comprises:
    reducing a pressure inside each reactor after each reactor contacts the surface of the substrate.

12. The method of claim 11, wherein the reducing the pressure is achieved by removing fluid from each reactor through a tube extending into the reactor.

13. The method of claim 10, wherein creating the pressure differential comprises increasing a pressure within the enclosed external environment relative to a pressure of each reaction area.

14. The method of claim 13, wherein the increasing the pressure comprises providing an inert gas into the enclosed external environment.

15. The method of claim 14 wherein the inert gas comprises nitrogen.

16. The method of claim 10, further comprising monitoring a sealing pressure between the plurality of flow cells and a surface of the substrate.

17. The method of claim 10, wherein a surface of the substrate is raised against a sealing surface of each of the plurality of flow cells.

18. An apparatus for processing a substrate, the apparatus comprising;
    a controller operable to execute processing instructions, the processing instructions causing the apparatus to:
    receive a substrate into a combinatorial processing chamber;
    create a pressure differential between each reaction area of the combinatorial processing chamber and an external environment of each reaction area, wherein each reaction area defines a site isolating region of the substrate; and
    combinatorially processing each region.

19. The apparatus of claim 18, wherein create the pressure differential comprises:
    increasing a pressure of the external environment relative to a pressure of each reaction area.

20. The apparatus of claim 18, wherein the controller executes processing instructions causing the apparatus to:
    raise a substrate support so that a surface of the substrate support contacts a sealing element of each reaction area;
    monitor a sealing pressure between each reaction area and the surface of the substrate; and
    terminate raising the substrate upon obtaining a pre-defined sealing pressure.

* * * * *